(12) United States Patent
Tsorng et al.

(10) Patent No.: US 11,102,906 B2
(45) Date of Patent: Aug. 24, 2021

(54) COMPUTER COMPONENT HOLDING APPARATUS

(71) Applicant: QUANTA COMPUTER INC., Taoyuan (TW)

(72) Inventors: Yaw-Tzorng Tsorng, Taoyuan (TW); You-Jin Liu, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/426,847

(22) Filed: May 30, 2019

(65) Prior Publication Data

US 2020/0068740 A1 Feb. 27, 2020

Related U.S. Application Data

(60) Provisional application No. 62/723,250, filed on Aug. 27, 2018.

(51) Int. Cl.
*H05K 7/00* (2006.01)
*H05K 7/14* (2006.01)
*H05K 5/02* (2006.01)

(52) U.S. Cl.
CPC .......... *H05K 7/1489* (2013.01); *H05K 5/0221* (2013.01); *H05K 5/0295* (2013.01); *H05K 7/1409* (2013.01); *H05K 7/1487* (2013.01)

(58) Field of Classification Search
None
See application file for complete search history.

(56) References Cited

U.S. PATENT DOCUMENTS

| 7,499,271 | B2 * | 3/2009 | Wagatsuma | G06F 1/181 361/679.33 |
| 7,894,195 | B2 * | 2/2011 | Lin | G06F 1/184 361/727 |
| 8,289,707 | B2 * | 10/2012 | Liao | H04Q 1/023 361/679.58 |
| 9,402,328 | B2 * | 7/2016 | Xu | H05K 7/20727 |
| 9,826,658 | B1 | 11/2017 | Mao et al. | |
| 9,829,935 | B2 * | 11/2017 | Shaw | G06F 13/409 |
| 10,372,177 | B2 * | 8/2019 | Kurosaki | H05K 7/20181 |
| 2004/0047128 | A1 | 3/2004 | McClelland, II et al. | |
| 2004/0264146 | A1 * | 12/2004 | Kerrigan | H05K 7/1487 361/726 |
| 2006/0061955 | A1 * | 3/2006 | Imblum | G11B 33/142 361/679.33 |

(Continued)

OTHER PUBLICATIONS

Extended European Search Report for EP Application No. 19193363.9, dated Jan. 8, 2020.

*Primary Examiner* — Anthony Q Edwards
*Assistant Examiner* — Rashen E Morrison
(74) *Attorney, Agent, or Firm* — Nixon Peabody LLP (57) ABSTRACT

The present disclosure provides a holding apparatus which includes a base tray and an expansion tray. The base tray can hold a first board, and the expansion tray can hold a second board. The expansion tray can fit within the base tray and can have a transition mechanism. The transition mechanism can engage first connectors on the first board to second connectors on the second board, or disengage the first connectors from the second connectors.

15 Claims, 8 Drawing Sheets

(56) References Cited

U.S. PATENT DOCUMENTS

| | | | | |
|---|---|---|---|---|
| 2008/0192431 A1* | 8/2008 | Bechtolsheim | ........... | G06F 1/20 |
| | | | | 361/695 |
| 2008/0212273 A1* | 9/2008 | Bechtolsheim | ......... | G06F 1/183 |
| | | | | 361/679.33 |
| 2012/0151098 A1* | 6/2012 | Sullivan | .................... | H05K 1/14 |
| | | | | 710/13 |
| 2013/0031390 A1* | 1/2013 | Smith, III | ............. | G06F 1/3293 |
| | | | | 713/320 |
| 2015/0014912 A1* | 1/2015 | Ivey | .................... | H05K 7/1415 |
| | | | | 269/309 |
| 2017/0311474 A1* | 10/2017 | Raisoni | ................ | H05K 7/1489 |

* cited by examiner

COMPUTER COMPONENT HOLDING APPARATUS

CROSS REFERENCE TO RELATED APPLICATIONS

This application claims priority under 35 U.S.C. § 119 to U.S. Provisional Application No. 62/723,250, entitled "COMBINE TRAY DESIGN FOR HIGH-SPEED SIGNAL CONNECTION," and filed Aug. 27, 2018. The contents of that application are hereby incorporated by reference in their entirety.

FIELD

The present disclosure relates to a holding apparatus for a computing device in a storage rack.

BACKGROUND

Computer chassis provide mechanical housing for computer components. In some instances, a single chassis can house more than one component, where each component is connected to another component to provide electrical communication between the components. This coupling needs to happen in a particular position; movement of one of the components can cause faulty connections or cause complete lapses in the communication. Computer chassis often do not provide secure means to stabilize computer components. Additionally, when more than one component is housed in the computer chassis, a user might wish to remove one of the components for maintenance or replacement needs. In a conventional system, the user must remove all of the components from the computer chassis, replace the appropriate component, and return the components to the computer chassis. This can be inefficient and inconvenient for a user who wishes to move just one component.

Therefore, what is needed is a means of stabilizing the components housed in a computer chassis to preserve communication links. An exemplary apparatus could allow individual components to be removed without removing all components.

SUMMARY

The various examples of the present disclosure are directed towards a holding apparatus to secure electronic components. In a first embodiment of the present disclosure, the holding apparatus includes a base tray and an expansion tray. The base tray can have a first portion and a second portion. The base tray can hold a first board with first connectors in the first portion. The expansion tray can fit within the second portion of the base tray, and can hold a second board with second connectors facing the first connectors. The expansion tray can also include a transition mechanism that transitions the second board between a first position and a second position. The first connectors and the second connectors can engage with each other in the first position and disengage in the second position.

In some examples, the base tray can fit within a computer chassis.

In some examples, the first board can be a graphics processing unit (GPU) board.

In some examples, the second board can be an expander PCIE board.

In some examples, the transition mechanism can include a lever and a pin. The pin can be positioned adjacent to the second board. The lever can push the pin towards the first board when transitioning to the first position, and can pull the pin away from the first board when transitioning to the second position.

In some examples, the base tray can also include a locking mechanism. The locking mechanism can include a lever, which transitions the holding apparatus between a loaded position and an unloaded position. The base tray engages with a computer chassis in the loaded position and disengages with the computer chassis in the unloaded position.

In some examples, the locking mechanism can include a lip and a latch. The lip can be on a first end of the locking mechanism, and can engage with an edge of a computer chassis. The latch can be on a second end of the locking mechanism, and can couple with an opening on the base tray.

A second embodiment of the present disclosure can provide for a computer chassis that includes a chassis body and a holding apparatus. The holding apparatus can have the features as described with respect to the first embodiment.

In some examples of the second embodiment, the first board can be a graphics processing unit (GPU) board. The second board can be an expander PCIE board.

In some examples of the second embodiment, the transition mechanism can include a lever and a pin. The pin can be positioned adjacent to the second board. The lever can push the pin towards the first board when transitioning to the first position, and can pull the pin away from the first board when transitioning to the second position.

In some examples of the second embodiment, the base tray can also include a locking mechanism. The locking mechanism can include a lever, which transitions the holding apparatus between a loaded position and an unloaded position. The base tray engages with the chassis body in the loaded position and disengages with the chassis body in the unloaded position.

In some examples, the locking mechanism includes a lip and a latch. The lip can be on a first end of the locking mechanism, and engage with an edge of the chassis body. The latch can be on a second end of the locking mechanism, and can couple with an opening on the base tray.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to a holding apparatus which includes a base tray and an expansion tray. The base tray can hold a first board, and the expansion tray can hold a second board. The expansion tray can have a transition mechanism, which provides for a mechanical coupling and uncoupling of the first and second board via first and second connectors. The expansion tray can provide for removing the second board from the holding apparatus without removing the first board from the holding apparatus as well. The holding apparatus can further include a locking mechanism that locks the holding apparatus into a computer chassis. This can provide further stability of the computer components.

Figure 1:
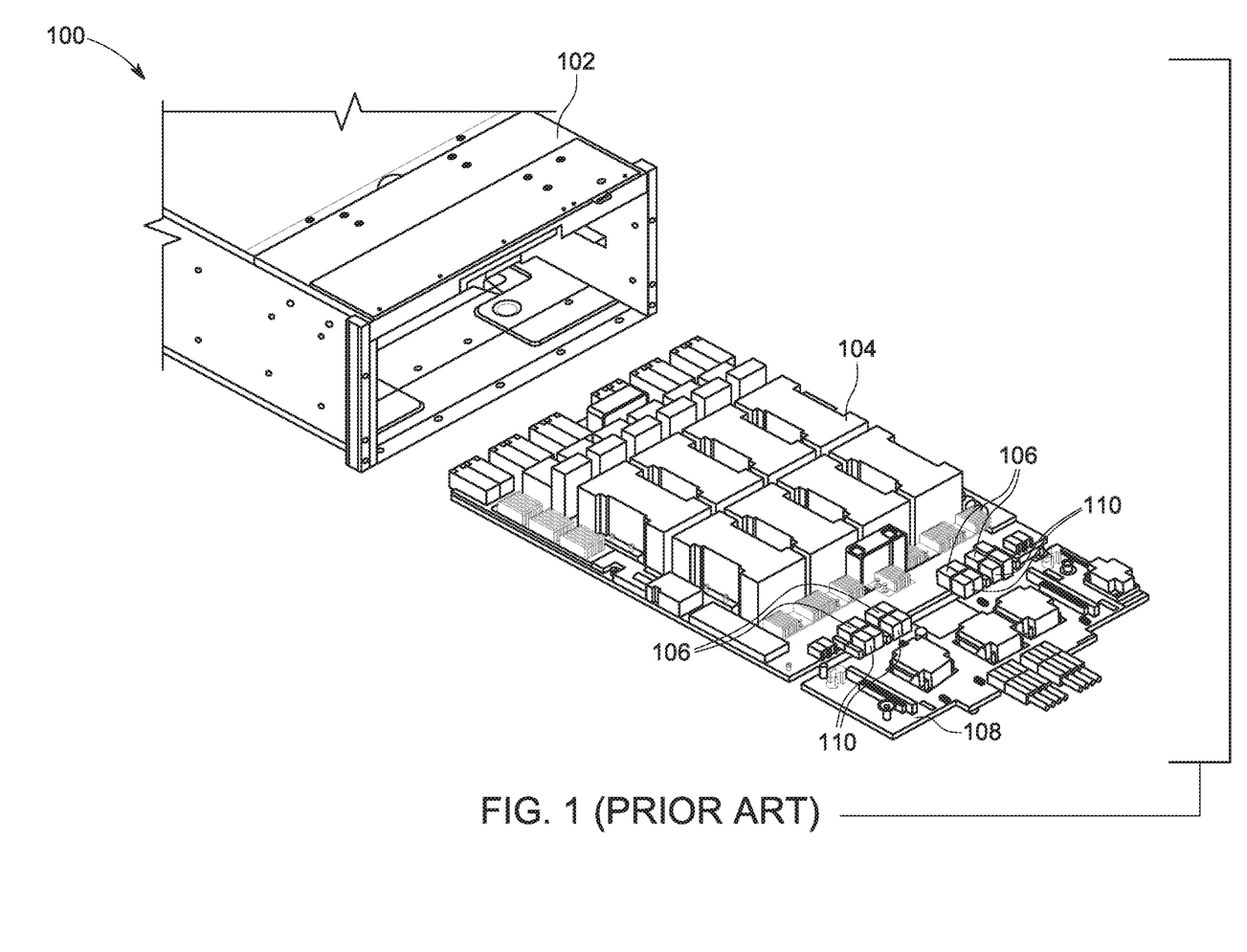
FIG. 1 shows computer components loading into a computer chassis, according to the prior art.

FIG. 1 shows a conventional computer chassis system 100, according to the prior art. System 100 can include chassis body 102, a first board 104, first connectors 106, a second board 108, and second connectors 110. Chassis body 102 can hold various computer components, such as first board 104 and second board 108. In some examples, first board 104 can be a GPU board, and second board 108 can be an expander PCIe board. First board 104 can have first connectors 106, which couple with second connectors 110 on second board 108. The connection between first connectors 106 and second connectors 108 can provide electronic communication between first connectors 106 and second connectors 108.

System 100 demonstrates that in a conventional computer system, computer components 104 and 108 can be loaded into a computer chassis 102 with no additional holding apparatus or means to stabilize the components. This lack of additional stability can allow the components 104 and 108 to be jostled out of their coupled position during movement of the computer chassis 102. Additionally, system 100 demonstrates that when one of the components 104 or 108 needs to be replaced, both must be removed from the computer chassis 102.

Figure 2:
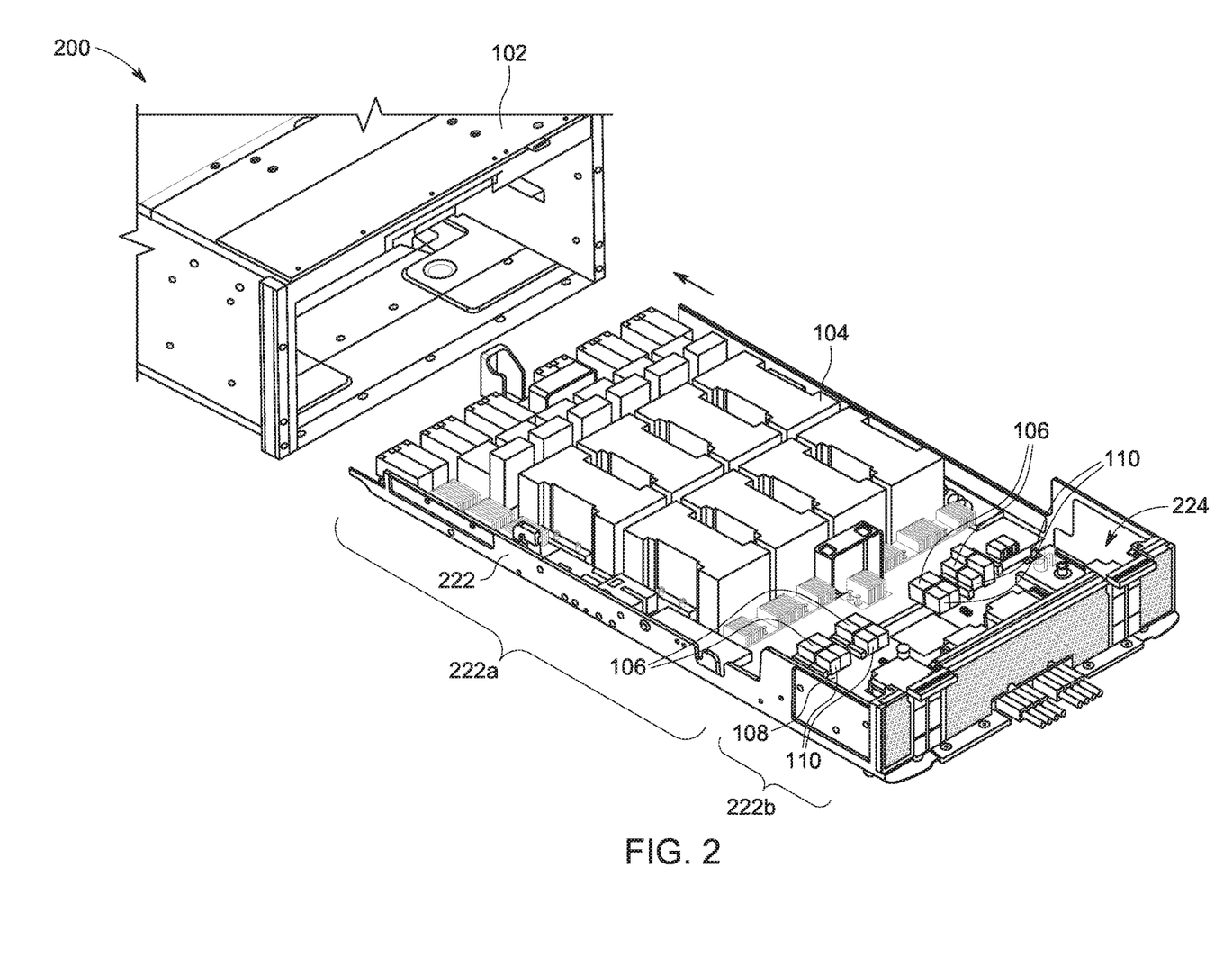
FIG. 2 shows an exemplary holding apparatus, according to an embodiment of the present disclosure.

In response to the limitations of conventional computer chassis, the present disclosure provides a holding apparatus configured to secure a first and second computer component in a computer chassis. FIG. 2 shows a system 200 with an exemplary holding apparatus, according to an embodiment of the present disclosure. System 200 can include many components and labels similar to system 100 of FIG. 1. System 200 can additionally include base tray 222 and expansion tray 224. For the purposes of the present disclosure, computer chassis 102 can include any housing which has computer components disposed in the housing.

Base tray 222 can be sized and shaped to fit within computer chassis 102. In some examples, base tray 222 can slide into computer chassis 102. Base tray 222 can have a first portion 222a, which is configured to receive first board 104, and a second portion 222b, which is configured to receive an expansion tray 224. Expansion tray 224 can house second board 108, such that second connectors 110 are arranged to adjacent to first connectors 106. In system 200, first board 104 and second board 108 are shown in a first position where first connectors 106 are coupled to second connectors 110 to provide communication between the components 104 and 108. For purposes of the present disclosure, first board 104 can be a GPU board, and second board 108 can be an expander PCIe board, as pictured. However, various other components can be used with regards to the present disclosure, so long as second board 108 is designed to mechanically and electronically connect to first board 104. In some instances, the present disclosure can provide for only a first board 104.

Therefore, base tray 222 provides a secure holding apparatus where movement of components 104 and 108 within computer chassis 102 is limited. This ensures a stable attachment of first connectors 106 to the second connectors 110, and preserves electrical communication links between the two components 104 and 108. Additional features and advantages of base tray 222 and expansion tray 224 are discussed further with respect to FIGS. 3-6.

Figure 3:
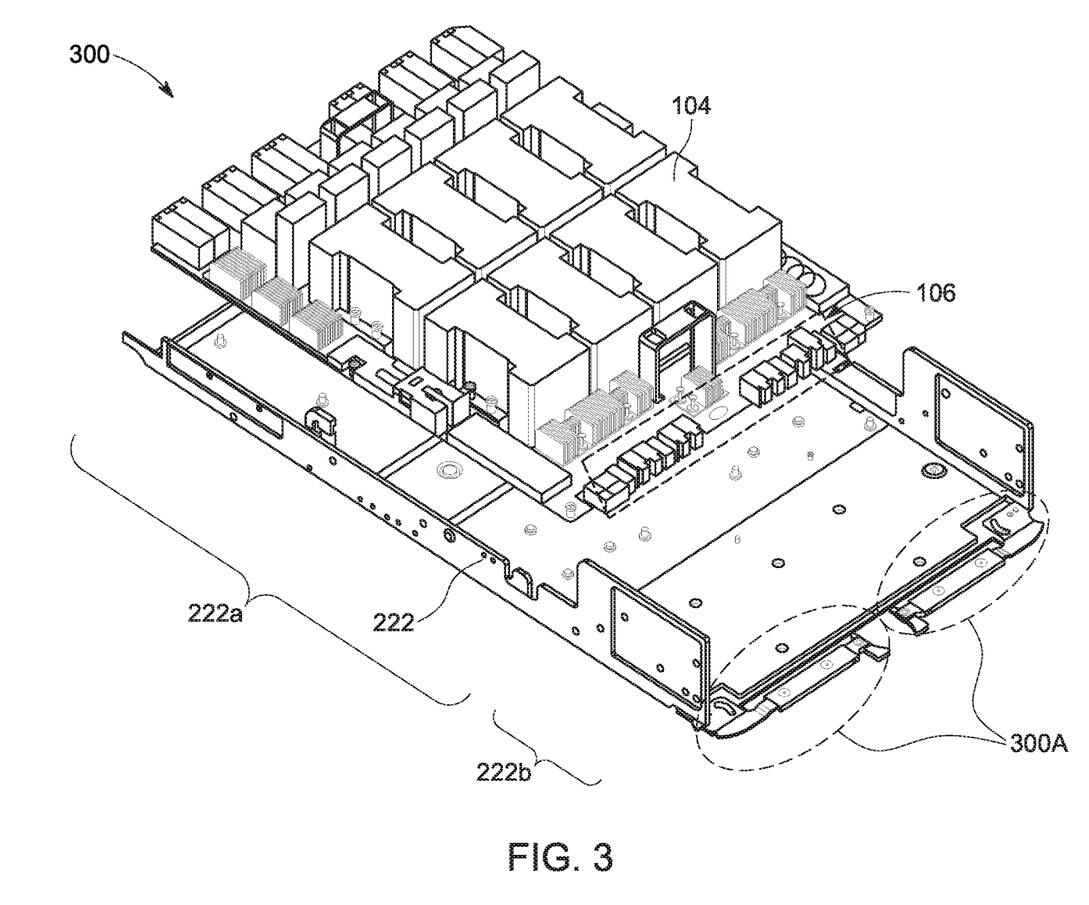
FIG. 3 shows a first board loading into an exemplary base tray, according to an embodiment of the present disclosure.

FIG. 3 shows a system 300 where a first computer board 104 is loaded onto an exemplary base tray 222, according to an embodiment of the present disclosure. System 300 can include many components and similar labels to systems 100 and 200 of FIGS. 1 and 2, respectively. System 200 can additionally include locking mechanism 300A.

FIG. 3 demonstrates how first board 104 can be loaded into the base tray 222 in a first portion 222a. First board 104 can be loaded in an orientation where first connectors 106 face second portion 222b. First board 104 can slide into base tray 222 and fit snugly, such that movement of computer chassis 102 will not move first board 104 out of position. For example, first board 104 can have one or more connector elements to secure first board 104 in position with base tray 222 (not pictured). For example, the connector elements can be guide pin connectors.

Figure 4A:
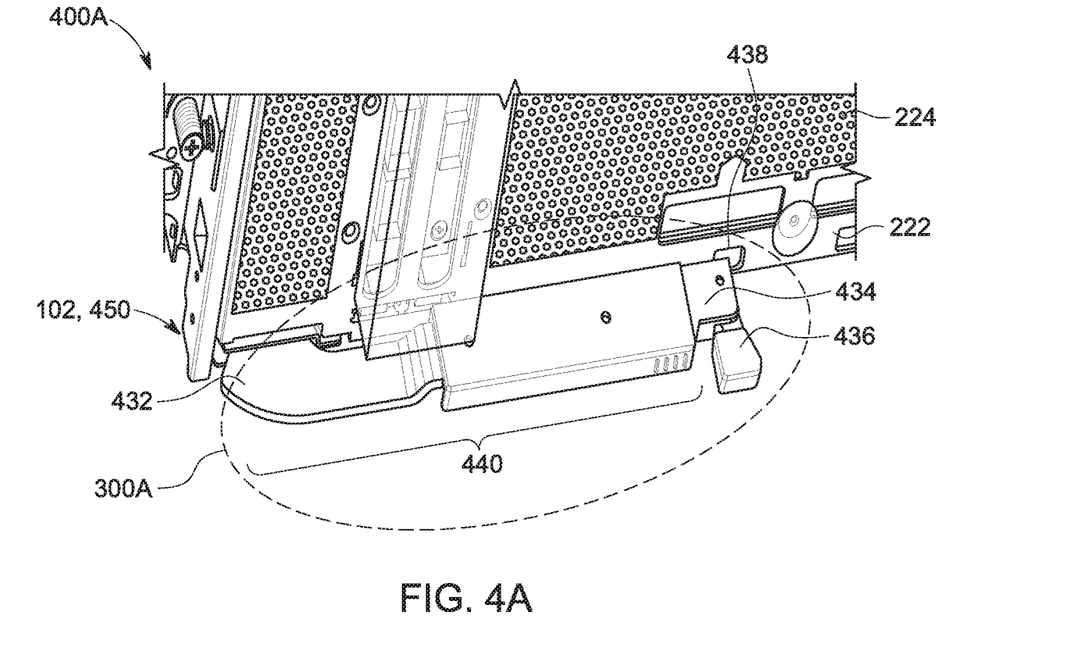
FIG. 4A shows a front view of an exemplary locking mechanism, according to an embodiment of the present disclosure.
Figure 4B:
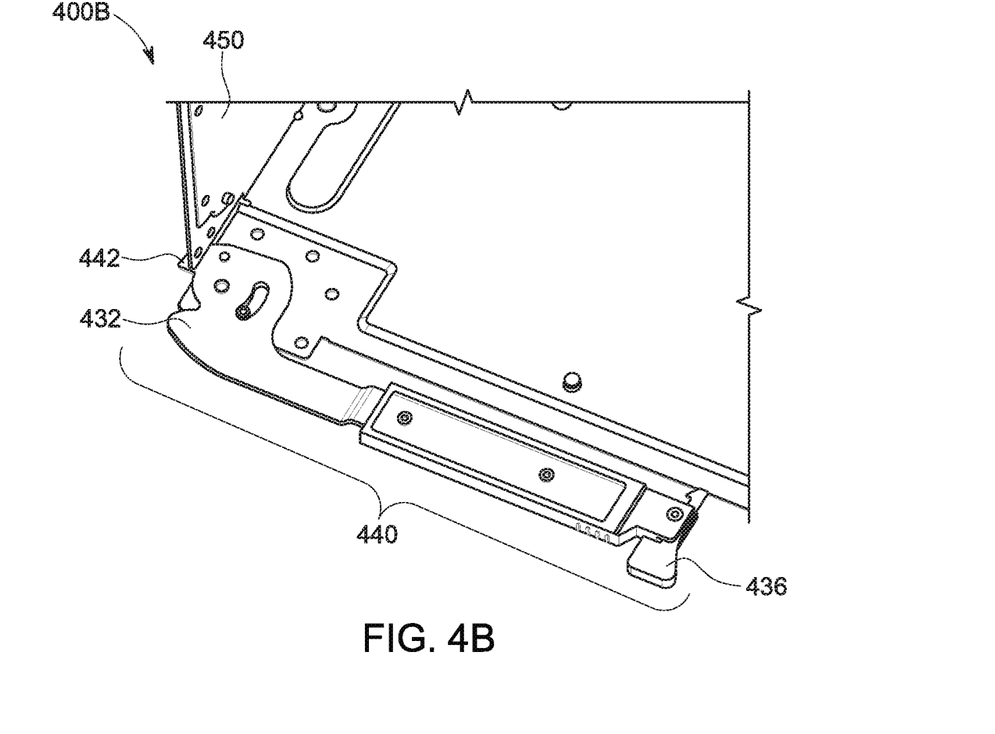
FIG. 4B shows a cutaway view of an exemplary locking mechanism, according to an embodiment of the present disclosure.

The locking mechanism 300A of FIG. 3 is shown in greater detail in the close-up views of FIGS. 4A and 4B. FIG. 4A shows a front perspective of a locked position 400A, and FIG. 4B shows a cutaway view 400B. FIGS. 4A-4B include many components and labels similar to system 300 of FIG. 3. FIGS. 4A-4B additionally include a lever 440 with a first end 432 and a second end 434, a latch 436, an opening 438, a lip 442, and an edge 450 of a computer chassis 102.

The locking mechanism 300A can have a lever 440, which includes a first end 432 and a second end 434. First end 432 can further comprise a lip 442, as shown in FIG. 4B. Lip 442 can snap into place behind an edge 450 of a computer chassis 102. Lip 442 can therefore secure base tray 222 to computer chassis 102. Locking mechanism 300A can also provide a latch 436 on a second end 434 of the lever 440. This latch 436 can be received by an opening 438 on base tray 222. Latch 436 can be uncoupled from opening 438 by a user when transitioning from a locked position 400A to an unlocked position 400A. Latch 436 can therefore provide additional stabilization when securing base tray 222 in computer chassis 102.

Figure 5A:
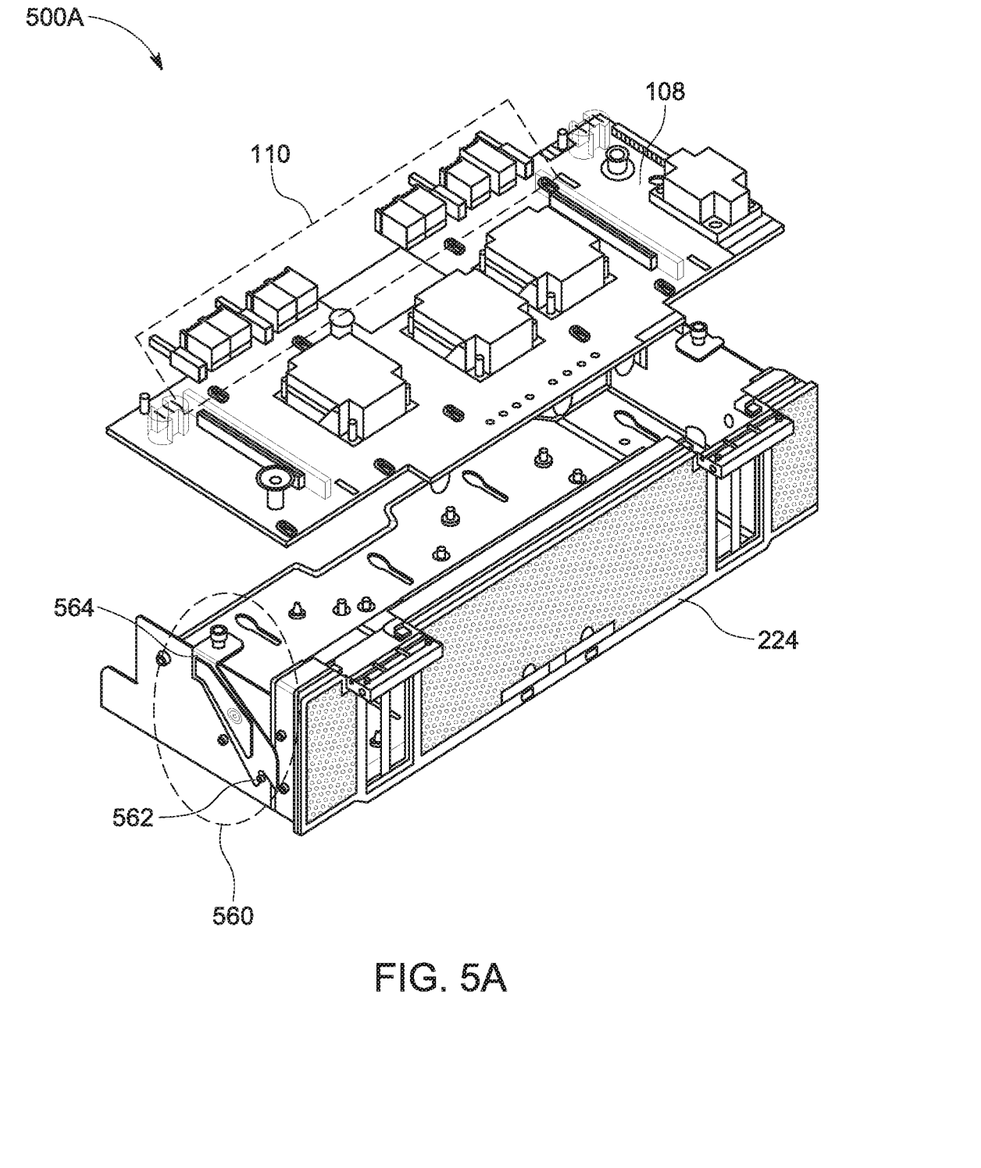
FIG. 5A shows a second board loading into an exemplary expansion tray, according to an embodiment of the present disclosure.
Figure 5B:
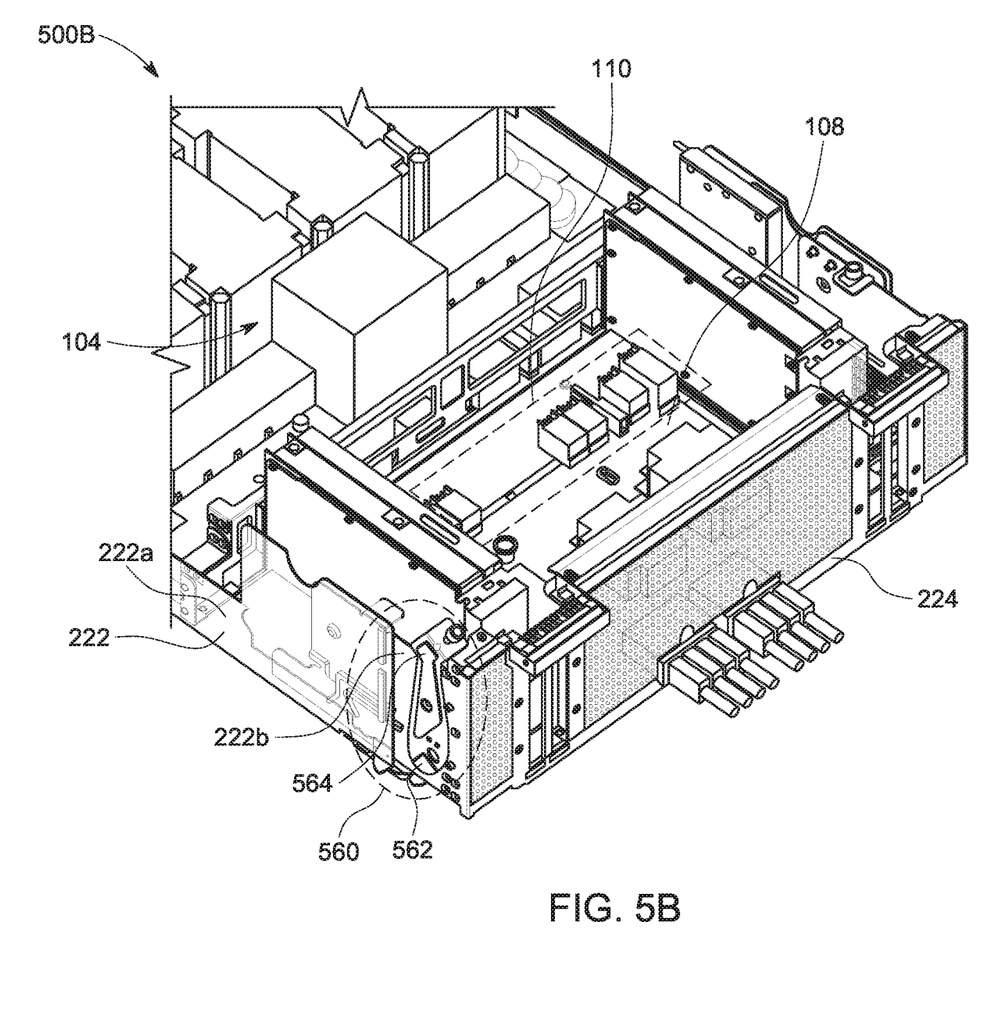
FIG. 5B shows an exemplary first position of the expansion tray, according to an embodiment of the present disclosure.
Figure 5C:
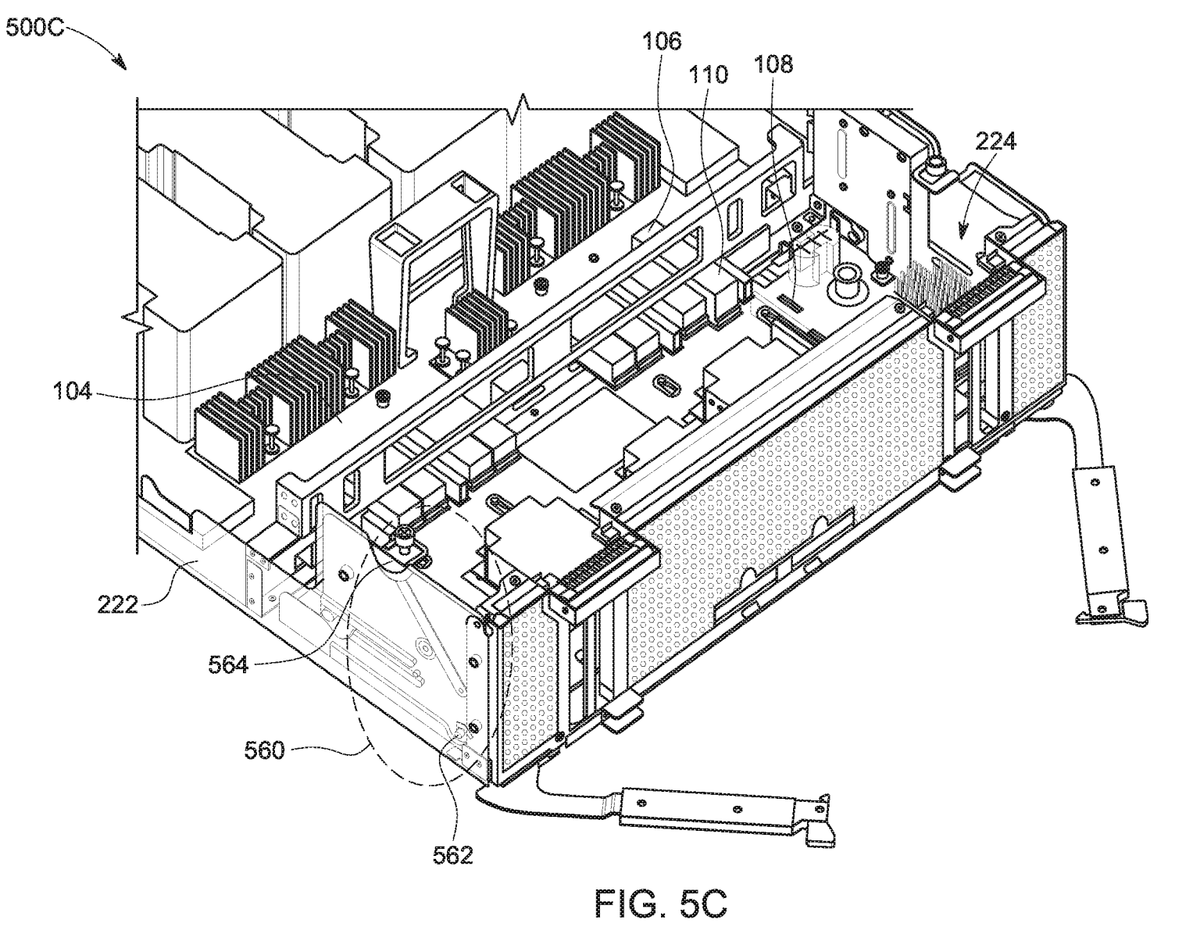
FIG. 5C shows an exemplary second position of the expansion tray, according to an embodiment of the present disclosure.

FIGS. 5A-5C show various positions of second board 108. FIG. 5A shows an exploded view 500A of second board 108 and expansion tray 224; FIG. 5B shows a perspective view 500B of expansion tray 224 inserted into base tray 222 (i.e. second portion 222b coupled to first portion 222a; and FIG. 5C shows a perspective view 500C of a transition mechanism 560. FIGS. 5A-5C include many components and labels similar to FIGS. 1-4B. FIGS. 5A-5C additionally includes a transition mechanism 560, a pin 562, and a lever 564.

FIG. 5A shows an exploded view of second board 108 and expansion tray 224. Second board 108 can be loaded into expansion tray 224, such that second connectors 108 face towards where expansion tray 224 interfaces with first board 104. Second board 108 can slide into expansion tray 224 and snuggly fit such that second board 108 experiences minimal disturbance due to movement of computer chassis 102. This results in a secure fit between second board 108 and first board 104 (as in FIG. 5C) when the components 106 and 110 are connected.

FIGS. 5A-5C further show a transition mechanism 560, which includes a pin 562 and a lever 564. A user can operate lever 564 to transition second board 108 between an engaged position and a disengaged position. In an engaged position (FIG. 5C), second connectors 110 communicatively couple with first connectors 106. In a disengaged position (FIG. 5B), second connectors 110 are not coupled with first connectors 106.

A user can move second board 108 from a disengaged position (FIG. 5B) to an engaged position (FIG. 5C) by pulling lever 564 in a counter-clockwise motion. Lever 564 is connected to pin 562, and pin 562 is coupled to second board 108. Thereby, counter-clockwise movement of lever 564 exerts force on an exterior edge of pin 562; this moves an interior edge of pin 562 (not shown) to move forward against first board 104. For example, the interior edge of pin 562 can be anywhere along a length of board 108. Pin 562 engages with second board 108 during the movement and pushes second board 108 into an engaged position (FIG. 5C). For example, lever 564 can cause a torque on pin 562. When second board 108 is in an engaged position (FIG. 5C), a user can move first board 104 into a disengaged position (FIG. 5B) by pulling lever 564 in a clockwise motion. Lever 564 causes pin 562 to move backwards, away from first board 104, thereby also bringing second board 108 away from first board 104.

Therefore, FIGS. 5A-5C demonstrate a transition mechanism that allows a user to easily insert and remove second board 108 from a computer chassis 102 without having to remove all components currently housed in the chassis 102.

Figure 6:
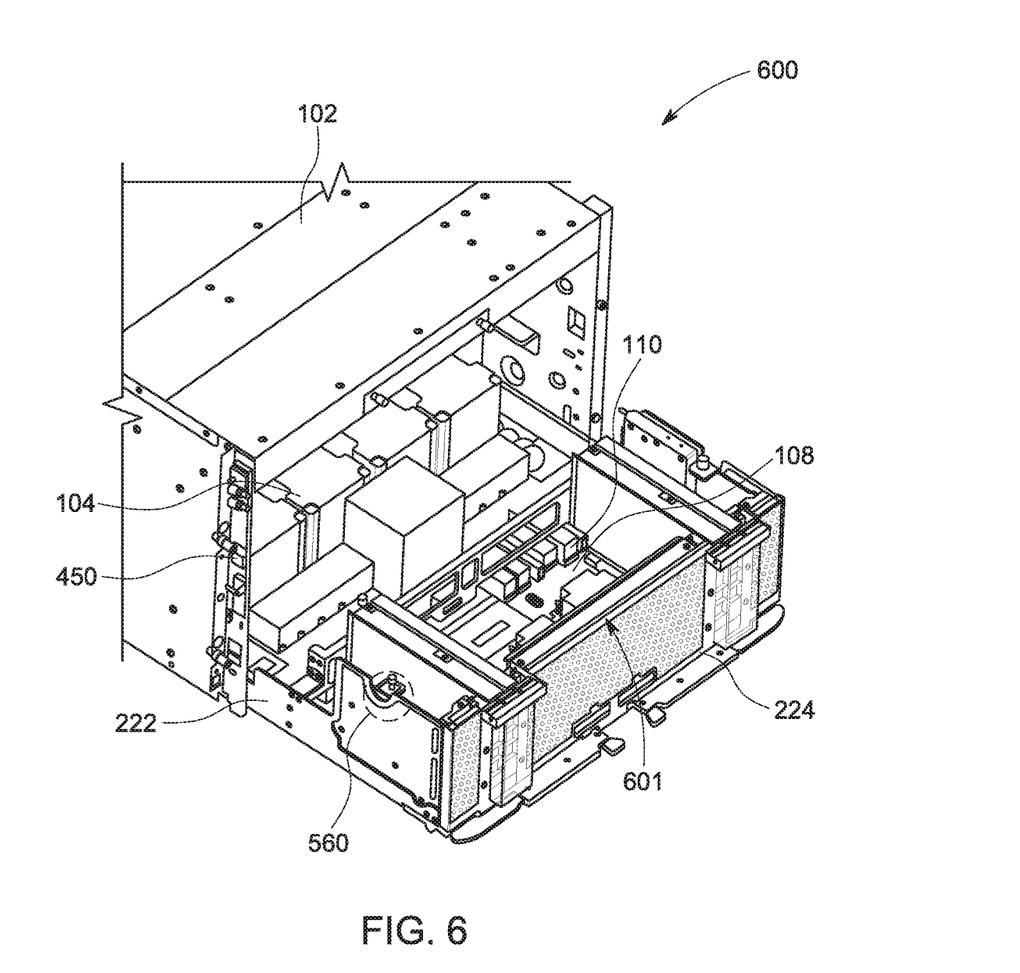
FIG. 6 shows an exemplary partially-loaded holding apparatus, according to an embodiment of the present disclosure.

FIG. 6 shows an exemplary, partially-loaded holding apparatus in a position 600 where components can be removed from the holding apparatus without removing the entire holding apparatus from a computer chassis. FIG. 6 includes many components and labels similar to FIGS. 1-5C. FIG. 6 demonstrates how a user can pull base tray 222 out of server chassis 102 such that only the second board 108 is exposed. A user can grasp an edge 601 of base tray 222 to pull the base tray 222 out of the server chassis 102. A user can then remove or replace second board 108 without needing to remove first board 104 from the computer chassis 102 as well.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A holding apparatus, comprising:
  a base tray with a first portion and a second portion, wherein the base tray is configured to hold a first board with first connectors in the first portion; and
  an expansion tray configured to fit within the second portion of the base tray and configured to hold a second board with second connectors facing the first connectors, the expansion tray comprising a transition mechanism that transitions the second board between a first position and a second position, the transition mechanism including a first lever operatively connected to and in direct contact with a pin, the pin being positioned adjacent to the second board;

wherein the first lever pushes the pin towards the first board and the pin engages with the second board when transitioning to the first position, and the first lever pulls the pin away from the first board when transitioning to the second position, and wherein the first connectors and the second connectors engage in the first position, and the first connectors and the second connectors disengage in the second position.

2. The holding apparatus of claim 1, wherein the base tray is configured to fit within a computer chassis.

3. The holding apparatus of claim 1, wherein the first board is a graphics processing unit (GPU) board.

4. The holding apparatus of claim 1, wherein the second board is an expander PCIE board.

5. The holding apparatus of claim 1, wherein the base tray further comprises a locking mechanism, wherein the locking mechanism comprises a second lever different from the first lever, the second lever configured to transition the holding apparatus between a loaded position and an unloaded position, wherein the base tray engages with a computer chassis in the loaded position, and the holding apparatus disengages with a computer chassis in the unloaded position.

6. The holding apparatus of claim 1, wherein the locking mechanism further comprises:
a lip on a first end of the locking mechanism, wherein the lip is configured to engage with an edge of a computer chassis; and
a latch on a second end of the locking mechanism, wherein the latch is configured to couple with an opening on the base tray.

7. The holding apparatus of claim 1, wherein the first lever pushes the pin towards the first board in response to rotation of the first lever about the pin in a first direction, and the first lever pulls the pin away from the first board in response to rotation of the first lever about the pin in a second direction counter to the first direction.

8. A computer chassis, comprising:
a chassis body; and
a holding apparatus, wherein the holding apparatus further comprises:
a base tray with a first portion and a second portion, wherein the base tray is configured to hold a first board with first connectors in the first portion; and
an expansion tray configured to fit within the second portion of the base tray and configured to hold a second board with second connectors facing the first connectors, the expansion tray comprising a transition mechanism that transitions the second board between a first position and a second position, the transition mechanism including a first lever operatively connected to and in direct contact with a pin, the pin being positioned adjacent to the second board;
wherein the first lever pushes the pin towards the first board and the pin engages with the second board when transitioning to the first position, and the first lever pulls the pin away from the first board when transitioning to the second position, and
wherein the first connectors and the second connectors engage in the first position, and the first connectors and the second connectors disengage in the second position.

9. The computer chassis of claim 8, wherein the first board is a graphics processing unit (GPU) board.

10. The computer chassis of claim 8, wherein the second board is an expander PCIE board.

11. The computer chassis of claim 8, wherein the base tray further comprises a locking mechanism, wherein the locking mechanism comprises a second lever different from the first lever, the second lever configured to transition the holding apparatus between a loaded position and an unloaded position, wherein the base tray engages with the chassis body in the loaded position, and the holding apparatus disengages with the chassis body in the unloaded position.

12. The computer chassis of claim 11, wherein the locking mechanism further comprises:
a lip on a first end of the locking mechanism, wherein the lip is configured to engage with an edge of the chassis body; and
a latch on the second end of the locking mechanism, wherein the latch is configured to couple with an opening on the base tray.

13. The computer chassis of claim 8, wherein the first lever pushes the pin towards the first board in response to rotation of the first lever about the pin in a first direction, and the first lever pulls the pin away from the first board in response to rotation of the first lever about the pin in a second direction counter to the first direction.

14. A holding apparatus, comprising:
a base tray with a first portion and a second portion, wherein the base tray is configured to hold a first board with first connectors in the first portion; and
an expansion tray configured to fit within the second portion of the base tray and configured to hold a second board with second connectors facing the first connectors, the expansion tray comprising a transition mechanism that transitions the second board between a first position and a second position, the transition mechanism including a first lever operatively connected to and in direct contact with a pin, the pin being positioned adjacent to the second board;
wherein the first lever pushes the pin towards the first board when transitioning to the first position, and the first lever pulls the pin away from the first board when transitioning to the second position,
wherein the first connectors and the second connectors engage in the first position, and the first connectors and the second connectors disengage in the second position,
wherein the first board is a graphics processing unit (GPU) board and the second board is an expander PCIE board, and
wherein the base tray further comprises a locking mechanism, wherein the locking mechanism comprises a second lever different from the first lever, the second lever configured to transition the holding apparatus between a loaded position and an unloaded position, wherein the base tray engages with a computer chassis in the loaded position, and the holding apparatus disengages with a computer chassis in the unloaded position.

15. The holding apparatus of claim 14, wherein the locking mechanism further comprises:
a lip on a first end of the locking mechanism, wherein the lip is configured to engage with an edge of a computer chassis; and
a latch on a second end of the locking mechanism, wherein the latch is configured to couple with an opening on the base tray.

* * * * *